United States Patent [19]

Gundry

[11] Patent Number: 4,507,791
[45] Date of Patent: Mar. 26, 1985

[54] ANALOG AND DIGITAL SIGNAL APPARATUS

[75] Inventor: Kenneth J. Gundry, San Francisco, Calif.

[73] Assignee: Dolby Laboratories Licensing Corporation, San Francisco, Calif.

[21] Appl. No.: 415,028

[22] Filed: Sep. 7, 1982

Related U.S. Application Data

[63] Continuation-in-part of Ser. No. 375,037, May 5, 1982.

[51] Int. Cl.³ ............................................. H04B 1/62
[52] U.S. Cl. ........................................ 375/27; 333/14; 381/101; 381/106
[58] Field of Search .................... 375/26, 27, 28, 30, 375/31, 32, 34; 455/63, 72, 266; 333/14; 340/347 AD, 347 CC; 370/109, 118; 360/25, 32; 381/29, 31, 32, 94, 101, 102, 106, 107, 98, 103, 108; 332/11 R, 11 D

[56] References Cited

U.S. PATENT DOCUMENTS 2,606,972  8/1952  Scott ................................. 381/98
4,072,914  2/1978  Haramoto et al. ................ 381/98
4,140,876  2/1979  Gagnon ............................. 375/30
4,363,006  12/1982 Ishigaki et al. .................... 381/106

Primary Examiner—Benedict V. Safourek
Attorney, Agent, or Firm—Majestic, Gallagher, Parsons & Siebert

[57] ABSTRACT

Apparatus for reducing unmasked quantizing noise modulation in adapting differential digital coding systems. In the digital encoder low frequency signals are boosted in the presence of dominating high frequency signals that are controlling the quantizing step size. The decoder has complementary cutting of low frequency signals. Optionally, unmasked high frequency noise modulation is reduced by variable pre- and de-emphasis.

30 Claims, 17 Drawing Figures

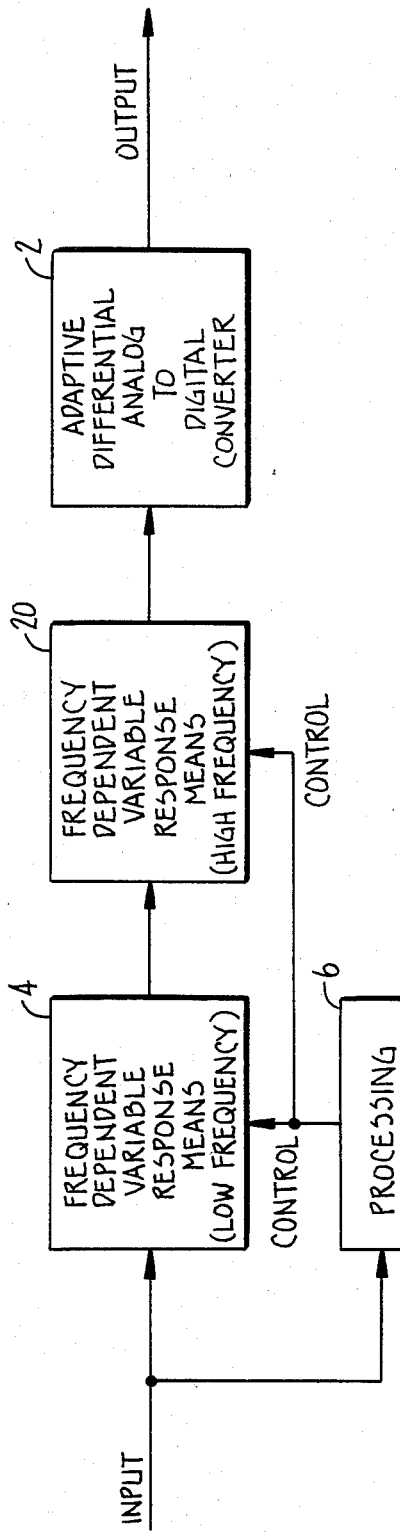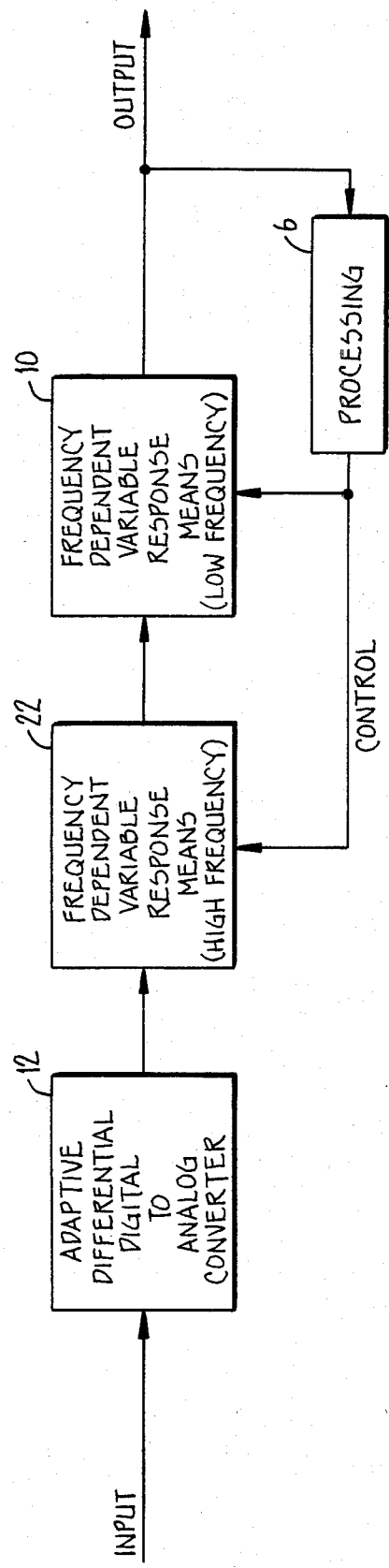

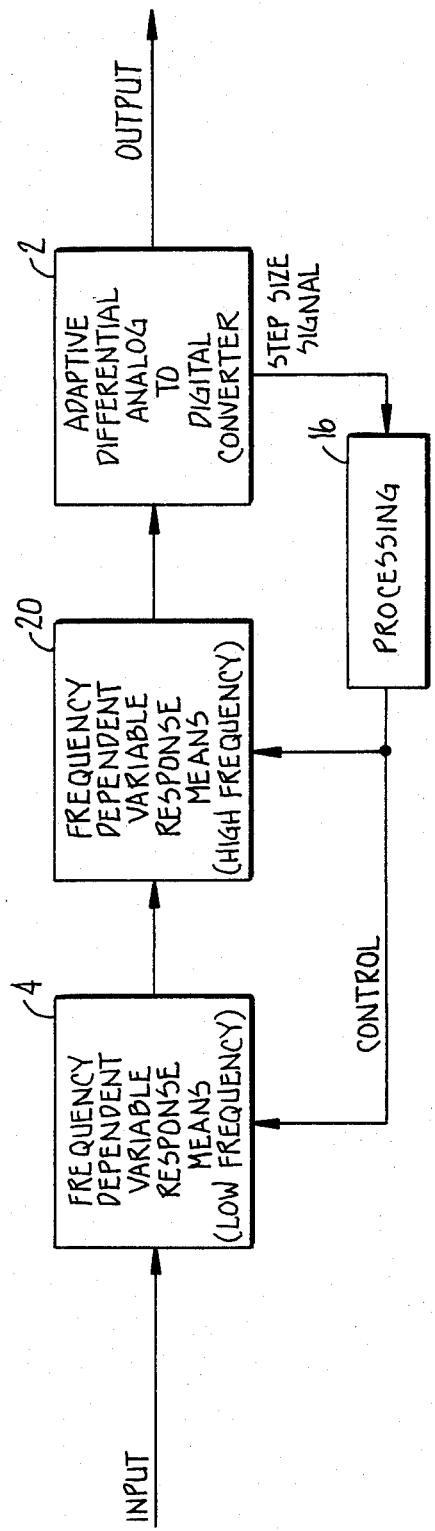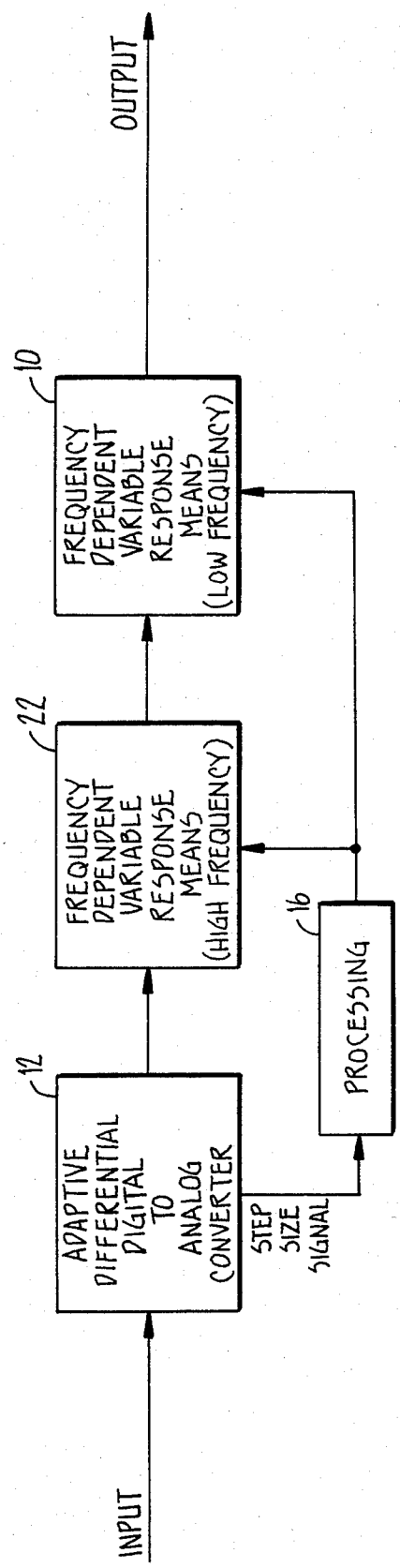

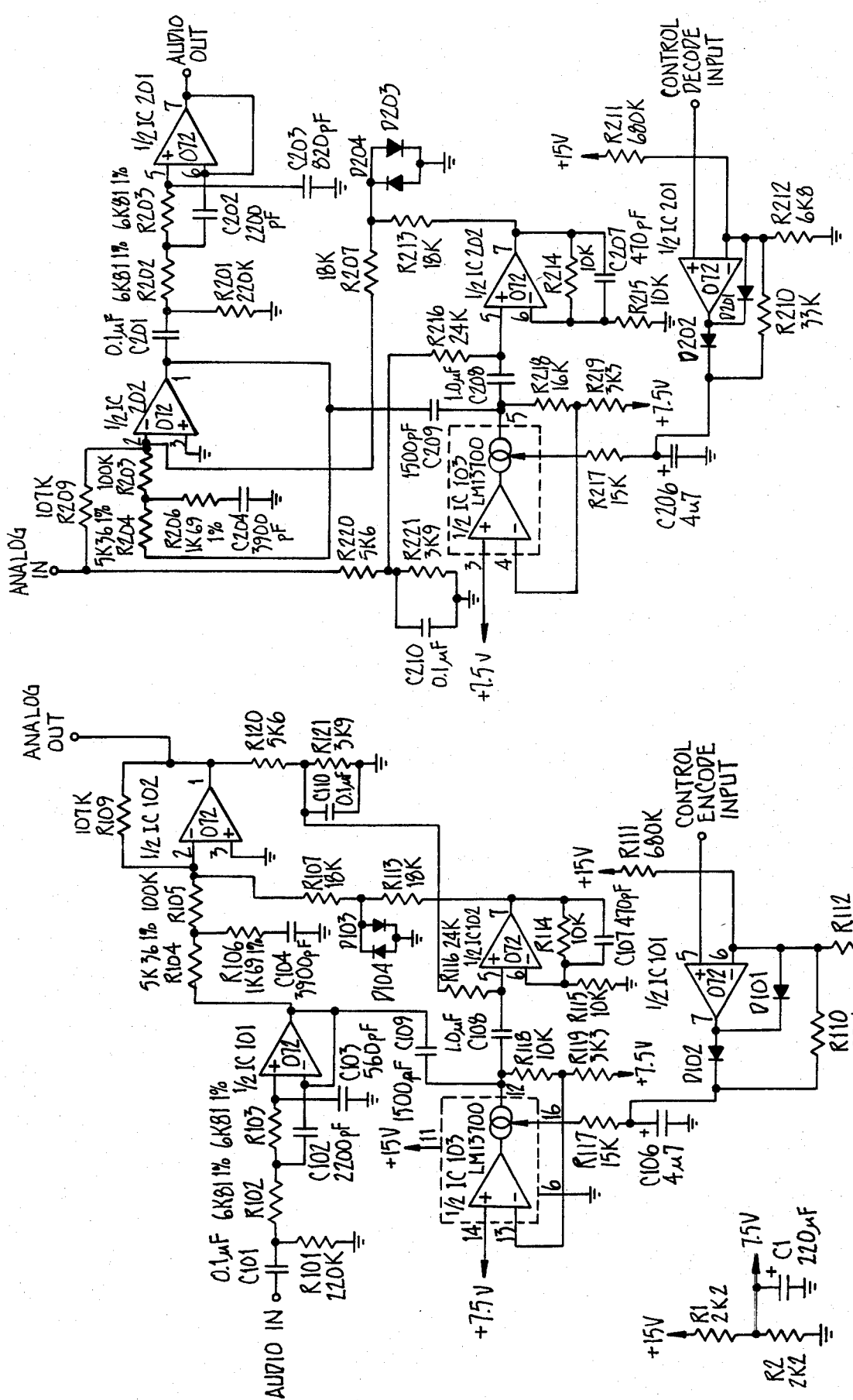

ANALOG AND DIGITAL SIGNAL APPARATUS

This application is a continuation-in-part of my copending U.S. patent application Ser. No. 375,037, filed May 5, 1982.

BACKGROUND OF THE INVENTION

The present invention relates generally to the reduction of noise in digital audio systems and particularly to digital audio systems employing adaptive differential coding techniques.

In this application, the terms "low frequency" and "high frequency" refer to the audible range and are used interchangeably with the terms "lower portion of the audio spectrum" and "upper portion of the audio spectrum," respectively. For the purposes of comprehension, low frequencies may be taken as those below about 1 kHz, and high, those above about 2 kHz. In practical embodiments different boundaries may apply depending, for example, on the upper and lower frequency limits of the system, the nature of the audio signals carried by the system (e.g. music, speech), etc.

Differential digital coding techniques, chiefly differential pulse code modulation (PCM) using one or more bits to represent a change from one or more previous quantum levels (rather than an absolute value relative to a reference level) are well known. Single bit differential PCM systems are generally referred to as delta modulation. All forms of differential PCM, including delta modulation, that employ fixed quantum step sizes suffer from the problem that if the waveform of the signal applied to the encoder changes too rapidly, the quantizer cannot keep pace. See generally *PCM and Digital Transmission Systems,* by Frank F.E. Owen, McGraw-Hill Book Company, San Francisco, 1982, pages 87–90.

One known solution is to provide for variable rather than fixed quantum step sizes such that the size of the quantizing steps varies with the time differential (slope) of the input signal, thus allowing the system to track more closely a rapidly varying input signal. Such systems are referred to as adaptive differential digital coding systems and include adaptive differential PCM (ADPCM) and adaptive delta modulation (ADM). Examples of a type of adaptive delta modulation system referred to as continuously variable slope delta modulation (CVSD) are set forth in U.S. Pat. Nos. 4,190,801 and 4,305,050, which are incorporated herein, each in their entirety, by reference.

A consequence of the fact that in adaptive differential digital coding systems the size of the quantizing steps varies with the slope of the input signal is that the quantizing error or noise depends on the input signal, being least for low slope signals and increasing for higher slope signals. The spectrum of the quantizing noise extends across the whole of the audio bandwidth, and typically has a roughly uniform power spectral density (that is, it resembles white noise).

It is a property of the human ear that low level noise in the same region of the spectrum as a loud sound cannot be perceived, an effect known as masking. However noise in parts of the spectrum remote from a loud or dominant signal remains audible. Masking permits the design of complementary noise reduction systems (companders) with which modulation of the background noise by the program is imperceptible. Since varying noise levels are much more obtrusive than constant ones, absence of audible noise modulation is an essential property of high quality audio systems for the reproduction of music.

In companders operating in analog audio systems the audible effects of noise modulation can be reduced by band-splitting or sliding band techniques whereby the degradation of signal to noise ratio accompanying a particular signal is confined to the same area of the spectrum as the signal, leaving the noise levels in other parts of the spectrum unaffected. Consequently, noise modulation only occurs in areas of the spectrum where it is masked by the dominant signal controlling the companding and is not perceived by the listener. Examples of band-splitting analog companders are given in U.S. Pat. Nos. 3,846,718, 3,903,485 and *Journal of the Audio Engineering Society,* Vol. 15, No. 4, October, 1967, pp. 383–388. Both of said U.S. patents are incorporated herein by reference, each in their entirety. Analog companders employing sliding band techniques are described in U.S. Pat. No. Re 28,426, U.S. Pat. Nos. 3,757,254, 4,072,914, 3,934,190 and Japanese Patent Application No. 55529/71. All four of said U.S. patents are incorporated herewith by reference, each in its entirety.

The adapting function in adaptive differential digital coding systems is a form of companding or noise reduction, inherently giving rise to modulation of the wideband quantizing noise by the signal. The slope of an input signal is proportional to the product of its frequency and amplitude. When the input signal contains predominantly high frequencies, its slope is high and the quantizing noise increases. The high frequency noise components will be masked by the signal, but the unmasked changes in the low frequency noise components will often be audible. If a wideband analog noise reduction system is used in conjunction with an adaptive differential digital system, the low frequency noise is increased even further by the expansion process. Consequently, there is a need to reduce such unmasked changes in audible low frequency noise components particularly in high quality audio systems for the reproduction of music, but such unmasked changes in low frequency noise components cannot be reduced by noise reduction companding.

When the input signal contains predominantly low frequencies, its slope is low and the quantizing noise remains low. Any variation in the low frequency components of the quantizing noise will be masked by the low frequency signals, and variations in the high frequency components, which may not be masked, may be insignificant because of the low level of the noise, or, if not insignificant there may also be a need to reduce such audible high frequency components in order to achieve noise reduction over the entire audio spectrum. In certain systems high frequency noise may be significant because of the use of techniques to shift the noise spectrum.

SUMMARY OF THE INVENTION

The present invention is directed to the suppression of low frequency noise modulation effects in audio systems employing adaptive differential digital coding techniques, and, alternatively, to the reduction of both low frequency and high frequency noise modulation effects in such systems.

In adaptive differential digital coding systems, the quantizing step size determines the slope of the input signal which can be accommodated by the quantizer without slope overload (or slope clipping as it is also termed). The present invention, as applied to low frequencies, is based on the recognition that when an adapting differential digital encoder is receiving a predominant high frequency signal and has a step size sufficient to accept that signal without slope overload, lower frequency signals present simultaneously can be boosted without significantly increasing the slope of the total input. For example, a quantum step size which accepts an input of x voltage at 10 kHz is capable alternatively of accepting 10x volts at 1 kHz. When complementary lower frequency cut is applied during reproduction (following digital to analog conversion), the low frequency components of the quantizing noise are reduced.

In practice, the invention as applied to low frequency noise requires, prior to the analog to digital converter (ADC), a circuit whose gain at low frequencies rises with increasing amplitudes of high frequency signal components in the input signal, and after digital to analog conversion (DAC), a complementary circuit whose gain at low frequencies falls with increasing amplitudes of high frequency signal components in the output signal. Note that these operations resemble expansion at the encoding stage and compression at the decoding stage, and are therefore in the opposite sense from the dynamic operations normally associated with noise reduction systems. Furthermore, conventional noise reduction systems operate mainly and most effectively when the input amplitude is small, while the present invention provides noise reduction when the input contains high amplitude high frequency signals. Moreover, this aspect of the invention differs from conventional noise reduction systems in that the control of signal levels at low frequencies does not depend on the low frequency content of the signal.

In some adapting ADC's such as said U.S. Pat. Nos. 4,190,801 and 4,305,050, the quantizing step size is continuously variable and, above an input slope threshold, adapts to a magnitude just sufficient to accommodate the slope; that is, above the threshold, the step size is directly proportion to the input slope, and therefore the quantizing noise is also directly proportional to the input slope. This relationship holds not only for the full spectrum of the quantizing noise but also for its low frequency components. Thus if an input signal has its predominant slope at a high frequency, the low frequency noise from the DAC is directly proportional to the amplitude of the high frequency. This is an undesirable feature of adapting digital systems, since the varying low frequency noise is not masked by the high frequency signal. If with the present invention the low frequency boost prior to the ADC and cut after the DAC are made directly proportional to the slope of the high frequency signal, then the changes in low frequency noise are accompanied by equal and opposite changes in low frequency gain, so that the low frequency noise emerges constant and independent of the high frequency content of the input signal.

In practice it will frequently not be possible or desirable to control the low frequency boost and cut over a large range, and the invention will therefore not eliminate but merely reduce the variation in low frequency noise accompanying high frequency signals.

In another aspect of the present invention, apparatus providing low frequency boost and cut in the presence of high level high frequency signals is combined with a noise reduction system operating selectively on high frequency noise so as to effectively suppress noise in adaptive differential digital coding systems across the entire audio spectrum. Certain aspects of such a high frequency noise reduction system are disclosed in my co-pending U.S. patent application Ser. No. 375,037, filed May 5, 1982.

BRIEF DESCRIPTION OF THE DRAWINGS

FIG. 6 is a generalized block diagram showing an alternative digital encoder embodiment of the invention.

FIG. 7 is a generalized block diagram showing an alternative digital decoder embodiment of the invention.

FIG. 8 is a generalized block diagram showing an alternative to the FIG. 6 embodiment of the invention.

FIG. 9 is a generalized block diagram showing an alternative to the FIG. 7 embodiment of the invention.

FIG. 15 is a schematic diagram of a portion of an encoder in accordance with the invention.

FIG. 16 is a schematic diagram of a portion of a decoder in accordance with the invention.

DETAILED DESCRIPTION OF THE INVENTION

Figure 1:
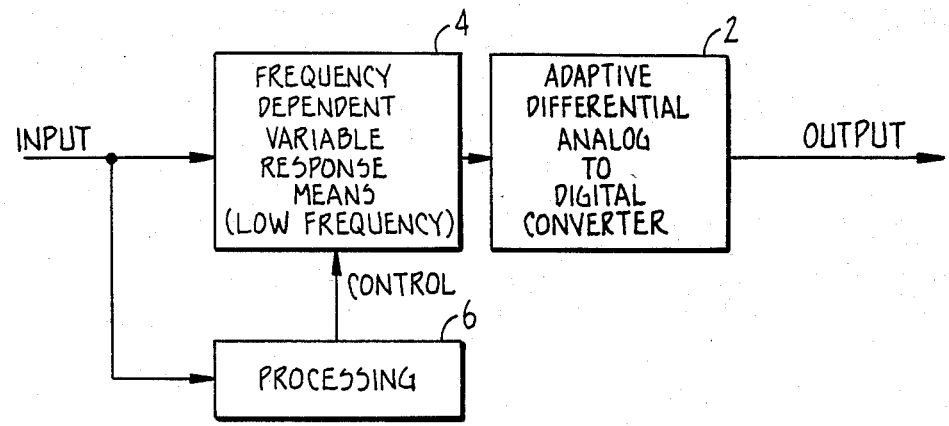
FIG. 1 is a generalized block diagram showing a digital encoder embodying the present invention.

Referring now to FIG. 1, a simple block diagram of an embodiment of the present invention is shown. Prior to conversion in a conventional adapting differential analog to digital converter 2 (e.g., ADM or ADPCM), the input signal is processed by a frequency dependent variable response means 4 operating at low frequencies. In practice, means 4 includes at least a variable low frequency boost circuit and may also include a threshold determining means. The degree of boost is controlled by a control signal which is derived from the input signal via a processing means 6. The control signal is responsive to the high frequency components of the input signal, such that when applied to the variable response means 4, there is increasing low frequency boost (above a threshold, if any) as high frequency components increase. In practice, processing means 4 includes a high pass and weighting filter followed by a rectifier and smoothing circuit. The processing means 4 may also include a threshold determining means. The input of processing means 6 may alternatively be derived from the output of the variable response means 4.

Figure 2:
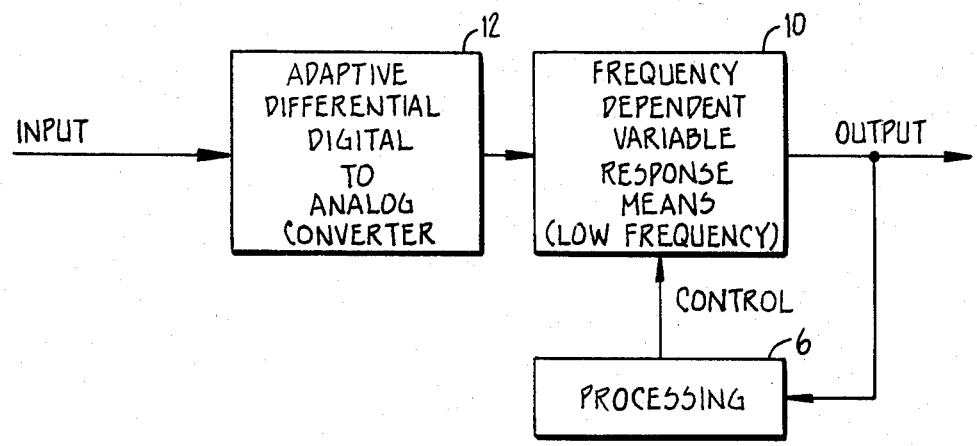
FIG. 2 is a generalized block diagram showing a digital decoder embodying the present invention.

FIG. 2 shows a block diagram of the complementary decoding arrangement. The processing means 6 corresponds to that in the embodiment of FIG. 1, and generates substantially the same control signal, which in the decoder represents the amplitude of the high frequency content of the output signal. It may derive its input from before or after means 10. The frequency dependent variable response means 10 operating at low frequencies provides, when the appropriate control signal is applied, a complementary response to means 4 in the encoder. In practice, it includes at least a variable low frequency cut circuit and may include a threshold determining means. The control signal varies the low frequency cut of the variable low frequency cut circuit so that the overall effect of boost in the encoder and cut in the decoder is a flat response. When the low frequency components of quantizing noise coming out of the digital to analog converter 12 rise in level because of the increase in step size required to accommodate a high amplitude high frequency signal, the response of the variable response means 10 changes from a flat response in order to provide low frequency cut, thereby attenuating the increased low frequency noise.

In typical systems, low frequency noise will be inaudible for quantizing step sizes below a certain value related to the amplitude of high frequency signal components. There is, of course, no need to provide for low frequency boost and cut when the low frequency noise is inaudible. Thus, in most practical embodiments a threshold level is provided in the processing means 6 or in the variable response means 4 and 10 such that low frequency boost and cut is not begun until a particular control signal level is reached, such as just before the low frequency noise becomes audible.

Figure 3:
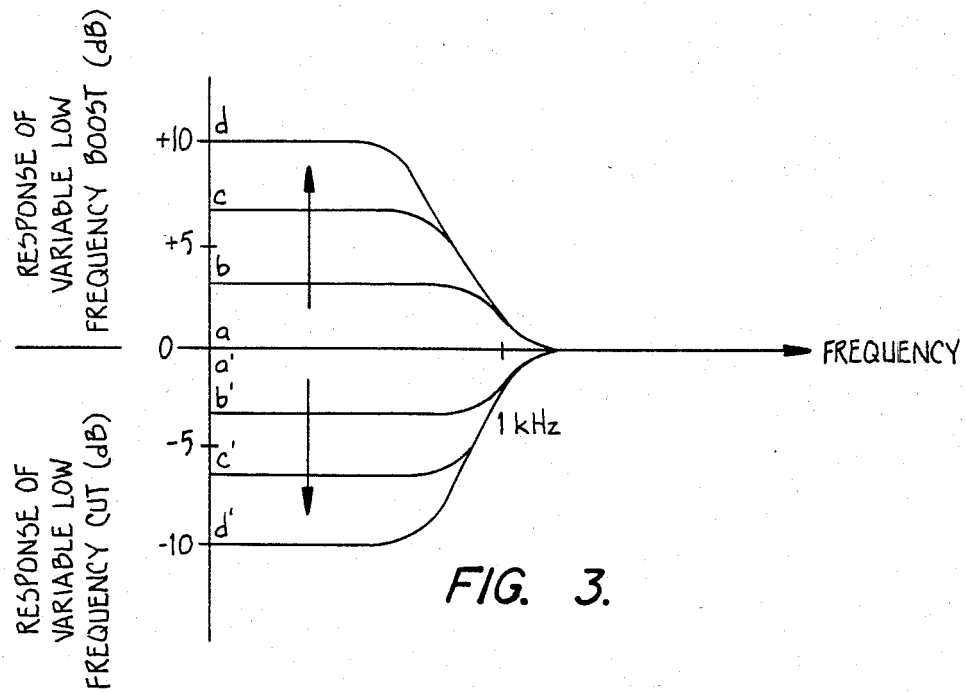
FIG. 3 is a set of exemplary response curves useful in understanding the present invention.

FIG. 3 shows a family of exemplary variable boost and variable cut curves. As stated above, for the purpose of comprehension, low frequencies may be taken as those below 1 kHz, while in practical embodiments a different boundary may apply. Accordingly, the family of curves in FIG. 3 have a turnover frequency of 1 kHz. Curves a and a' are simply a flat response for the case of no boost in the variable response means 4 of FIG. 1 and no cut in the variable response means 10 of FIG. 2. As the control signal increases with an increasing amplitude of high frequency components in the input signal, the variable boost circuit provides a rising low frequency boost response such as to curves b, c and d while the same control signal applied to the variable cut circuit provides a complementary low frequency cut response such as to curves b', c' and d', respectively for particular values of control signal. There is, of course, a continuum of curves, responsive to continuous values of control signal. The maximum boost and cut in this example is 10 dB. In practical embodiments it may be possible to effectively reduce the noise with less boost and cut. Also, as explained further below, the maximum boost and cut is usually limited by undesirable side effects.

Curves such as shown in FIG. 3 may be implemented by conventional fixed band variable shelf circuits. In some applications, a sliding band shelf circuit having a variable turnover frequency may provide a more effective match to the low frequency noise spectrum at various quantizing step levels. The most effective curve shape will depend, in particular applications, on the low frequency noise spectrum. Although a shelf response is generally satisfactory, more sophisticated response characteristics may be desirable in critical applications. Also, in some applications simpler response characteristics, may be acceptable.

In the embodiments of FIGS. 1 and 2, the low frequency gain is controlled by a signal derived from the analog audio signals. In certain types of digital audio systems there are signals present in the ADC's and DAC's from which control signals are derivable that are suitable for controlling the low frequency gain. For example, in some designs of adaptive delta modulation, e.g., said continuously variable slope delta modulation systems known as CVSD, the step size is determined by a control voltage whose value is directly proportional to the slope of the input signal. This applies to the CVSD systems described in said U.S. Pat. Nos. 4,190,801 and 4,305,050.

In such CVSD systems, if an arbitrary maximum input signal level is defined, then the value of this control voltage carries information about whether or not the input signal contains high amplitude high frequency signals. For example, if the maximum level at 1 kHz generates 0.2 volt, then the maximum level at 10 kHz will generate 2 volts, and to a rough approximation we can say that any signal generating more than say 0.3 volt contains high slope signals at high frequencies. This control voltage can therefore be used to operate on the variable low frequency boost and cut circuits instead of a separately generated control signal as in the embodiments of FIGS. 1 and 2. Other types of adaptive differential digital encoders and decoders may also have signals present from which suitable control signals can be derived.

Figure 4:
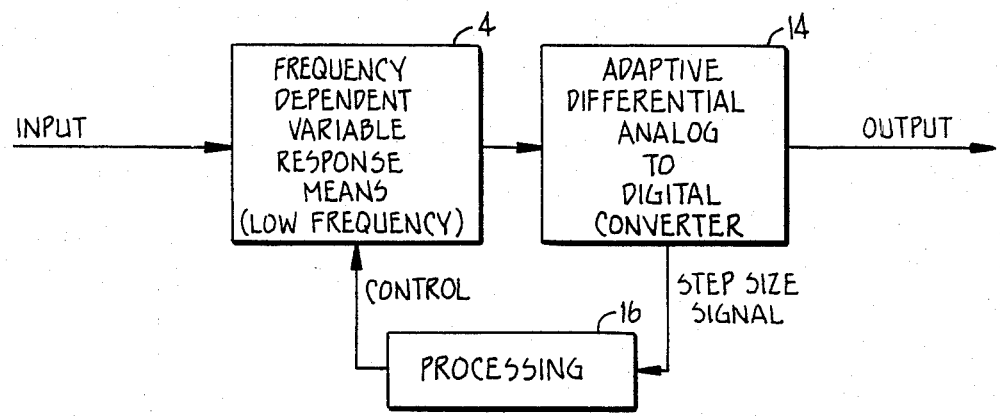
FIG. 4 is a generalized block diagram showing an alternative to the FIG. 1 embodiment of the present invention.

Referring now to FIG. 4, a block diagram of such an arrangement is shown in which the step size control voltage from an adaptive differential analog to digital converter 14, such as a CVSD ADC, is applied to the frequency dependent variable response means 4 via processing means 16. The implementation of means 4 is the same as described above, in connection with FIG. 1. Processing means 16 may include a threshold determining means and means, if necessary, to shape the analog signal from the ADC 14. If the step size control signal from ADC 14 is digital, the processing means 16 will include a digital to analog converter. As in the case of the FIG. 1 embodiment, the offset, if applied, is such that low frequency boost is not applied until the control voltage is large enough to indicate the presence of a high slope signal at high frequencies. The boost then increases progressively with increasing input slope as suggested in FIG. 3.

Figure 5:
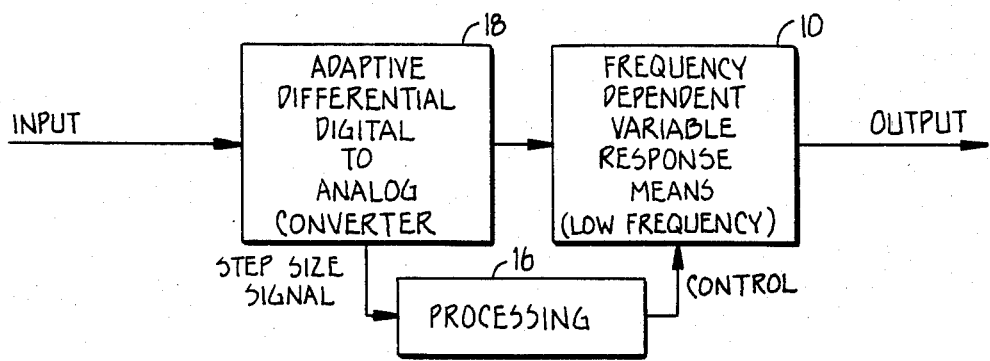
FIG. 5 is a generalized block diagram showing an alternative to the FIG. 2 embodiment of the present invention.

FIG. 5 shows the complementary demodulation arrangement in which the step size control signal from an adaptive differential digital to analog converter 18, such as CVSD DAC, is applied to the frequency dependent variable response means via processing means 16.

In the embodiment of FIG. 4, a positive feedback loop is provided by the arrangement of the control signal derived from the ADC controlling the low frequency level of the signal applied to the ADC. Consequently, the loop gain must be such that it is not unstable. Also, the amount of boost and the frequency range over which it is applied must be limited such that the arrangement does not cause the control signal to reach the threshold or to defeat the purpose of the system by increasing the step size (and consequently, the noise).

In the following described embodiments, means for reducing high frequency noise in addition to low frequency noise are provided. The embodiments of FIGS. 6 and 7 correspond generally to the embodiments of FIGS. 1 and 2, but include the means for reducing high frequency noise. The embodiments of FIGS. 8 and 9 corespond in the same way to the embodiments of FIGS. 3 and 4, respectively.

Referring now to FIGS. 6 and 7, encoding and decoding embodiments are shown, respectively, in which complementary frequency dependent variable response means 20 and 22 operating in the high frequency portion of the audio spectrum are provided. Details of the complementary variable response means 20 and 22 are set forth following the general description of FIGS. 6 through 9. In the encoder embodiment of FIG. 6 and the decoder embodiment of FIG. 7, single control signals for the high frequency and low frequency variable response means (4,10,20,22) are derived from the respective input and output signals via processing means 6. As in FIGS. 1 and 2, each processing means 6 typically includes a high pass and weighting filter so that the control signal responds only to high frequency signal components and also typically each includes a rectifier and smoothing circuit having a suitable time constant such that a DC control voltage is developed that substantially follows the envelope of the high frequency components. The input to processing means 6 can also be taken at the output of means 20 or the input of means 22.

Alternatively, instead of deriving a single control signal for means 4 and 20, separate control signals can be derived using independent processing means. This may be desirable in critical applications in order to optimize the action of the high frequency and low frequency variable response means.

In FIGS. 8 and 9, additional encoder and decoder embodiments, respectively, are shown that are generally the same as the embodiments of FIGS. 6 and 7 except that the control signal (or signals if independent processing means are used) for the various high frequency and low frequency variable response means are derived from the converters 2 and 12 via processing means 16 in the manner of the FIGS. 3 and 4 embodiments.

In the embodiments of FIGS. 6-9, the sequence in which the high frequency and low frequency variable response means operate on the analog signals can be reversed from the sequence shown without affecting the operation of the system because the means operate in independent, essentially non-overlapping portions of the audio spectrum. It is also possible to operate on the signal with both the high and low frequency means essentially at the same point in the signal path as is explained below in connection with a practical embodiment.

The frequency dependent variable response means operating at high frequencies (block 20 in FIGS. 6 and 8) and the complementary means (block 22 in FIGS. 7 and 9) preferably provide variable pre-emphasis in the encoder embodiments (FIGS. 6 and 8) and complementary variable de-emphasis in the decoder embodiments (FIGS. 7 and 9).

A conventional design approach in adaptive digital systems, which, as discussed above, are in effect digital companders, is to provide fixed response shaping networks (pre- and de-emphasis) in order to alter the spectrum of quantizing noise in the hope that noise in the most audible range of the spectrum (usually high frequencies) will remain inaudible even when it has risen to its highest level as a result of adaptation in response to a signal at a frequency which will not mask this most audible noise. Unfortunately, this is often a vain hope, and pre-emphasized digital companders usually give audible noise modulation on critical musical material.

The permissible response of a shaping network is a compromise between two incompatible requirements. At the output of the DAC, it is desirable to introduce a large loss at the frequencies at which noise or error is most audible; the input of the ADC will then require the inverse network, giving a large gain at these frequencies. However this gain increases the probability of system overload, and hence reduces the effective dynamic range of the system to wideband signals. In other words, fixed pre- and de-emphasis do not necessarily increase the dynamic range.

The frequency dependent variable response networks 20 and 22, with or without associated gain, change the shape of their response characteristic in response to the control signal. They may be viewed as an adaptive pre- and de-emphasis in combination with the ADC and DAC, whereby the most audible high frequency noise is reduced by the response shaping network whenever input signal amplitudes do not lead to system overload, but when overload would occur, the networks adapt to avoid boosting predominant spectral components while retaining noise reduction where noise might be audible in the presence of those spectral components. Such a system permits much more boost and cut in the presence of predominant signals at frequencies where noise is not a problem, and can therefore render noise modulation inaudible.

Band-splitting and sliding band analog companders such as cited above, are of course examples of adaptive pre- and de-emphasis; in addition to frequency dependent variable response (i.e. adaptive response) networks, they normally include their own circuits to measure the amplitude and spectrum of the audio signals to operate the variable response or adaption. The processing means 6 (FIGS. 6 and 7) and 16 (FIGS. 8 and 9) may include such circuits, with appropriate changes in frequency response, if required.

In adaptive digital systems using variable scaling, the ADC contains a control signal or scaling factor, usually digitally derived, which must be reconstructed in the DAC (the embodiments of FIGS. 8 and 9, for example). The control signal may be employed to operate on adaptive response networks; the control signal can be regarded as a digitally derived measurement of the audio signal which is originally generated in the ADC and which can be reconstructed to any desired degree of accuracy at the DAC. Hence one of the major problems in an analog compander, that of making the identical measurement of the signal at the sending and receiving ends, is eliminated, and accurate "tracking" between the variable pre- and de-emphasis is easier to achieve.

In practice, the frequency dependent variable response networks 20 and 22 will take the form of frequency dependent variable gain devices such as fixed band or sliding band compressors and expanders (compander systems) operating at high frequencies, such as those cited above.

In conventional analog companders, the audibility of noise modulation depends on the compression ratio; the higher the ratio the larger the signal amplitude before the noise level rises sufficiently to become audible. Unfortunately, high compression, and therefore expansion, ratios lead to tracking errors because of the discrepencies between the measurements of the signal made at the compressor and the expander, and practical analog companders usually have ratios in the range 1.5 to 3. The precision with which the digitally derived control signal can be reconstructed permits the use of somewhat higher ratios in the embodiments of FIGS. 8 and 9. The combination of adaptive pre-emphasis and scale factor derivation within the ADC can be considered as an output controlled compressor whose compression ratio depends on the control characteristics of the variable network and the input/output characteristics of the digital measurement. Knowing the latter it is possible to derive the former required to provide a given required compression ratio.

Figure 10:
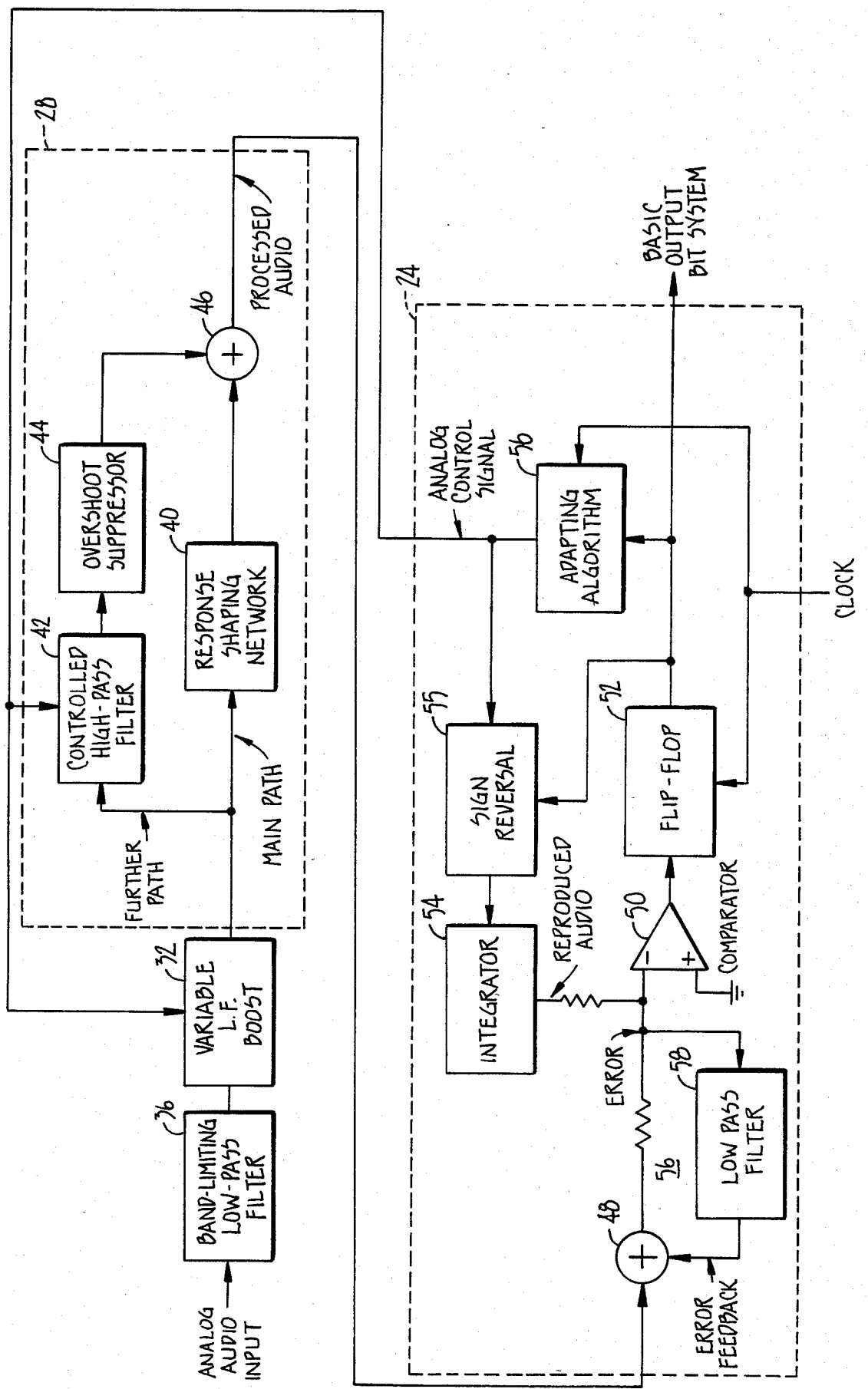
FIG. 10 is a block diagram showing a digital encoder embodiment of the invention.
Figure 11:
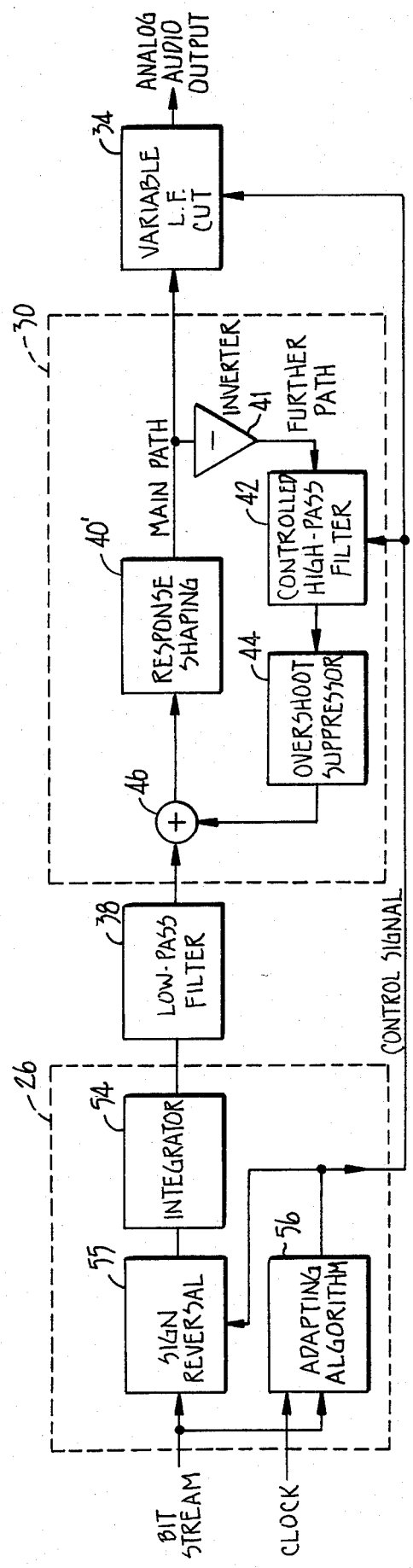
FIG. 11 is a block diagram showing a digital decoder embodiment of the invention.

Referring now to FIGS. 10 and 11, more specific embodiments of the arrangements of FIGS. 8 and 9, respectively, are shown. In these embodiments, a relatively simple, low cost, high performance digital encode/decode audio system is provided: the known advantages of adaptive delta modulation are retained including its hardware simplicity, while further increasing the dynamic range of the system without the introduction of annoying side-effects such as noise modulation. The resulting system is particularly suitable for use in low cost, data rate limited systems wherein high dynamic range and signal to noise ratio are desired.

Various delta modulation schemes are described in the article "Delta Modulation" by H. R. Schindler, *IEEE Spectrum*, Vol. 7, pp. 69-78, Oct. 1970. The article includes a discussion of adaptive delta modulation and it also has an an extensive bibliography. An adaptive delta modulation system is also described in "High Performance Digital Audio Systems" by Robert I. Masta, *Electronic Products*, p. 66, Apr. 20, 1982. Adaptive delta modulation systems are also disclosed in U.S. Pat. Nos. 4,190,801; 4,254,502; 4,305,050; and 4,313,204. The said U.S. Pat. No. 4,254,502 and U.S. Pat. No. 4,313,204 are also incorporated herein by reference, each in their entirety.

The A to D and D to A converters 24 and 26 are of the adaptive continuously variable slope delta modulation (CVSD) type. Such devices are well known. In order to reduce further audible noise, error feedback is employed in the ADC 24. Such techniques are also known. See for example U.S. Pat. No. 2,927,962; U.S. Pat. No. 4,313,204 and "Reduction of Quantizing Noise by Use of Feedback" by Spang and Schultheiss, *IRE Trans. Commun. Syst.*, Vol. CS-10, pp. 373-380, December 1962. A high frequency sliding band compressor 28 and a complementary sliding band expander 30, each controlled by its associated converter, provide the high frequency noise reduction.

The amount of noise reduction provided by the sliding band system and the frequency spectrum in which it is effective can be chosen to match the noise spectrum that remains even with the use of error feedback. For example, unless the clock rate is sufficiently high, significant noise will remain at very high audio frequencies when error feedback correction is employed. By configuring the sliding band noise reduction system to operate in that region of the audio spectrum the combination of the two results in a reduction of noise throughout the high frequency audio spectrum while operating at clock rates that would otherwise be unacceptable for high quality audio. The combination of this arrangement with a variable low frequency boost 32 and complementary variable low frequency cut 34 arrangement configured to reduce any remaining low frequency noise results in the reduction of substantially all noise throughout the audio spectrum.

The sliding band devices can take various forms as set forth in the prior art cited above. In this embodiment the devices are modifications of well known sliding band devices known as B-type compressors and expanders, an early form of which is described in U.S. Pat. No. Re 28,426. In this application no control circuitry is required because the control signal is derived from converters 24 and 26. In addition, the devices are required to operate only at high frequencies because of the low frequency noise reduction achieved by the low frequency variable boost and cut arrangement and due to the predominantly high frequency nature of the noise spectrum in this delta modulation system when the error feedback correction employed does not fully push the noise spectrum out of the usable audio band due to the use of a relatively low clock rate. As mentioned above, it is desirable that the companding system does not act at low frequencies because such an arrangement would increase the unmasked changes in low frequency noise in the presence of high frequency signals. Thus the frequency bands in which the high frequency noise reduction and in which the low frequency boost/cut operate should be essentially mutually excusive.

Referring to FIG. 10, the input to the system a simple two pole low pass filter 36 band limits the audio input signal. In contrast to conventional PCM systems with low sampling rates, complex anti-aliasing filters are not required. A similar low pass filter 38 is inserted after DAC 26 (FIG. 11). The sliding band compressor 28 is a dual path Type I device similar to that described in said U.K. Published Patent Application No. 2,079,114A. The main path contains fixed, level-independent response shaping 40 in accordance with FIG. 14, permitting the transmission of high level, high frequency signals.

The further path contains a voltage controlled single pole high-pass filter 42. In the quiescent state, its cut-off frequency is about 10 kHz. The effect of the variable filter is a compressor with a compression ratio dependent on the shape of the filter/control characteristic, such compression occurring above a threshold level dependent on the loop gain of the control system. The gain before summation with the main path is 14 dB, giving a quiescent pre-emphasis which rises at 6 dB/octave from about 2 kHz to about 10 kHz. Above a threshold value of the control signal, this pre-emphasis moves upwards in frequency as an increasing function of a control signal derived from the bit stream. Overshoot suppression 44 (described in U.S. Pat. No. Re 28,426) prevents transient distortion in the A to D converter. The main and further paths are summed in a combiner 46.

The processed audio from the sliding band compressor 28 is fed via a summation stage 48 to a comparator 50. The other input to the comparator is audio which has been reproduced from the output digital bit stream. The output of the comparator is sampled at the clock rate by flip-flop 52 to become the output bit stream. The output bit stream controls the polarity of the integration (block 54) so that the reproduced audio follows the input audio. The adapting algorithm 56 uses the bit stream to produce an analog control voltage which is integrated (block 54) to construct the audio. The control signal is also used to control the analog noise reduction system.

The error which has been made by this conversion process appears at the comparator input. The error signal is taken through an error feedback loop 56 having a low pass filter 58 and is combined with the processed audio. This process shifts the spectrum of the error upwards in frequency. With a sufficiently high sampling rate, there is sufficient room above the upper limit of the audio frequency range and below the clock frequency into which to move the error spectrum. Thus most of the quantizing noise can be shifted out of the audible range, leaving far less audible noise than is usually associated with a conventional delta-modulation system. If a lower sampling rate is used there is some residual very high frequency noise as discussed above.

The basic output bit stream is then processed as may be uniquely necessary for application to the transmission medium.

Referring now to FIG. 11, details of the decoder complementary to the encoder of FIG. 10 are shown. The signal from the transmission medium is processed as may be required to provide the basic input bit stream. The processing means will include means for deriving a clock signal. Such techniques are well known in the art.

The D to A converter 26 is an adaptive delta demodulator which is identical to a portion of the A to D converter 24. The comparator 50 and error feedback loop 56 are not required for the demodulator. Blocks 54, 55 and 56 are the same in both converters. The audio output from the integrator output passes via a two-pole low-pass filter, to the complementary sliding band expander 30. This also has a two-path configuration in which the main path has a level-independent response shaping 40' (inverse of FIG. 14) and the further path provides negative feedback from the output to a summing combiner 46 at the input via a variable high-pass filter 42 and overshoot suppressor 44. The filter 42 is operated by the control signal derived from the bit stream in the D to A converter, and the result is a response complementary to that of the encoding noise reduction processor.

Figure 13:
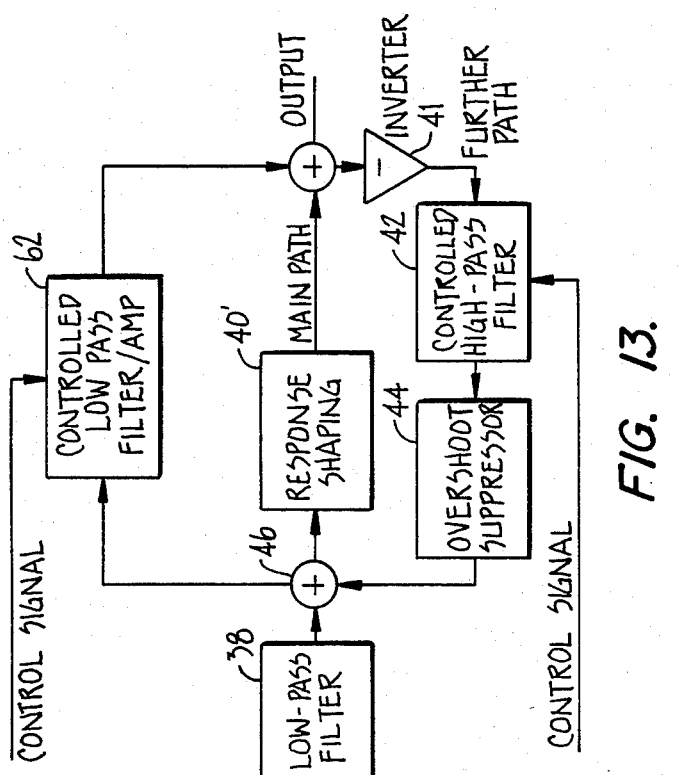
FIG. 13 is a block diagram showing an alternative to a portion of the embodiment of FIG. 11.
Figure 12:
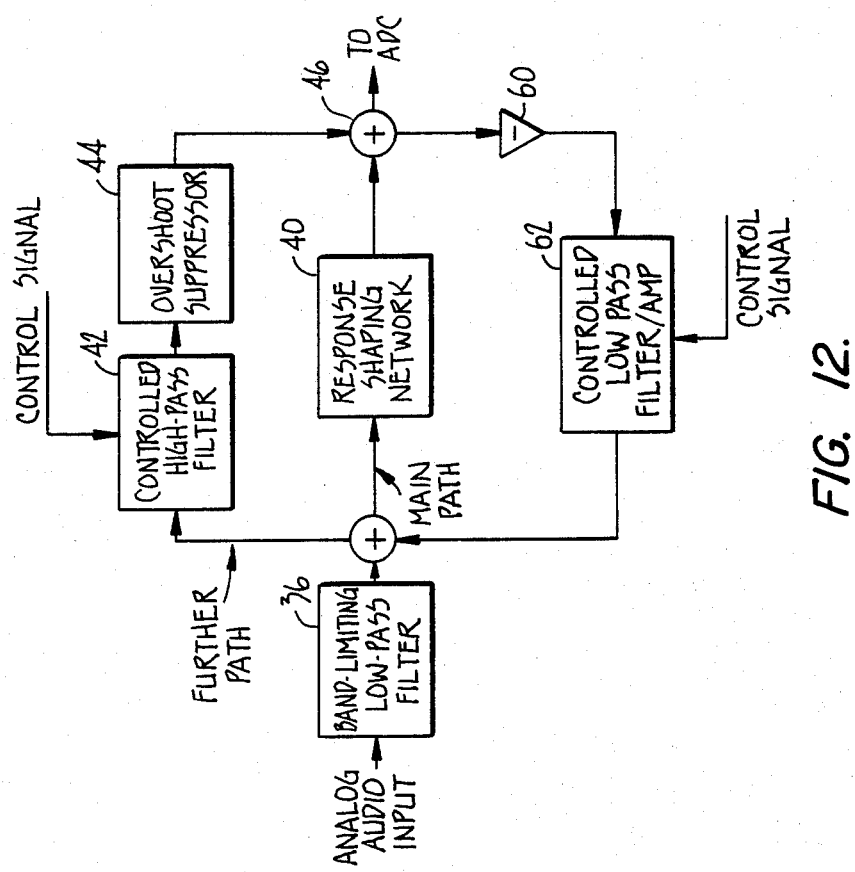
FIG. 12 is a block diagram showing an alternative to a portion of the embodiment of FIG. 10.

The statements above with reference to the description of the embodiments of FIGS. 6–9 concerning the relative locations of the high frequency and low frequency variable response means also apply to the variable low frequency boost means 32 and sliding band compressor 28 of FIG. 10 and to the varaiable low frequency cut means 34 and sliding band expander 30 of FIG. 11. That is, the order in which the circuits operate on the analog signals does not affect the result because the circuits operate in separate, substantially non-overlapping frequency bands. Because this is the case the arrangement can be simplified such that the variable low frequency boost and cut means form further side paths in the sliding band compresser and expander, respectively, as shown in FIGS. 12 and 13. The result is equivalent to providing means external to the expander and compressor as in FIGS. 10 and 11.

Referring to FIG. 12, the variable low frequency boost means is formed by a negative feedback loop that includes an inverter 60 and a block 62 having a controlled low pass filter and an amplifier providing fixed gain. The control signal for the controlled low pass filter can be the same analog control signal from ADC 24 that is applied to the controlled high pass filter 42.

In FIG. 13 the variable low frequency cut means is formed by a positive feed forward loop that includes the same elements as in block 62 of FIG. 12.

Figure 14:
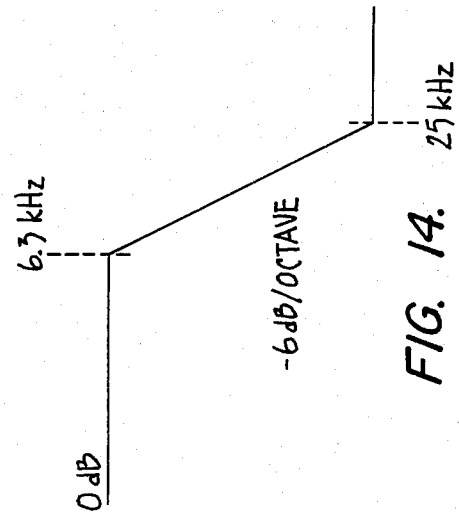
FIG. 14 is an exemplary frequency response curve of a network employed in encoder embodiments of the invention.

FIG. 14 shows an exemplary frequency response curve of the response shaping network 40 employed in the encoders of FIGS. 10 and 12. The response is fixed and level independent. The complementary response is employed in network 40' in the decoders of FIGS. 11 and 13.

Figure 17:
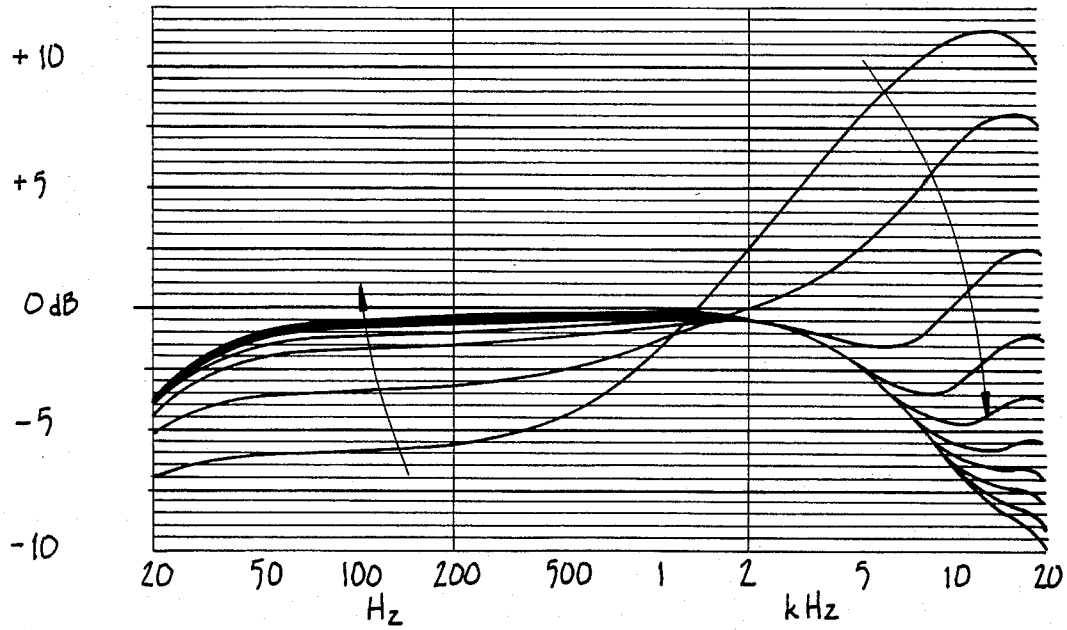
FIG. 17 is a set of exemplary response curves useful in understanding the operation of the circuit of FIG. 15.

Practical embodiments of the arrangement of FIGS. 12 and 13 are shown in the schematic diagrams of FIGS. 15 and 16. The circuits are for use with a CVSD type delta modulation system such as described above in connection with the embodiments of FIGS. 10 and 11 (e.g. block 24 of FIG. 10 and block 30 of FIG. 11.) The control voltage from the delta modulator is used to operate on a single current controlled resistor that provides both a sliding band high frequency boost and a variable low frequency boost. In this case, as explained further below, the low frequency boost actually consists of a diminishing low frequency cut and the high frequency boost is superimposed on the high frequency de-emphasis provided by network 40. FIG. 17 shows a representative set of frequency response curves for progressively increasing values of control voltage (which is proportional to increasing input signal slope). The arrows in FIG. 17 indicate the direction of increasing control signal voltage. In FIG. 16 the complementary decoder is shown in which the control voltage from the delta demodulator also controls a single current controlled resistor that provides, in the case of the decoder, a sliding band high frequency cut and a variable low frequency cut. The decoder response characteristics are complementary to those in FIG. 17. In the encoder and decoder it is possible to use the same current controlled resistor for both the high frequency sliding band function and the variable low frequency response function because the functions occur in separate frequency bands, as is explained further below.

Referring now to the details of FIG. 15, the audio input signal is applied to a 2 pole low pass input filter having a cut off frequency of about 16 kHz. The filter is comprised by $\frac{1}{2}$ IC101 (an operational amplifier, i.e. "op amp") along with its associated resistor and capacitors (C101, C102, C103, R101, R102 and R103). The filter output is applied to the main path in which the anti-saturation network comprised by R104, R106 and C104 is placed. This combination of components forms a single pole low pass filter having a corner frequency at about 6 kHz. The anti-saturation network output is applied to an adder/inverter (op amp $\frac{1}{2}$ IC102). The input filter output is also applied to capacitor C109 which, along with the current controlled resistor ($\frac{1}{2}$ IC103) forms a variable high pass filter. The current controlled resistor is controlled by a signal processed from the CVSD delta modulator applied at the control encode input. The processing includes a peak hold and threshold circuit that includes op amp $\frac{1}{2}$ IC101, diodes D101, D102 resistors R110 and R112 and the reference voltage applied through resistor R111. A low pass filter having a corner frequency of about 700 Hz comprised by R120, R121 and C110 forms a negative feedback path from the output of the adder/inverter ($\frac{1}{2}$ IC102) to the input of the op amp ($\frac{1}{2}$ IC102). Capacitor C108 has zero impedance at the audio frequencies involved. Consequently, the low pass filter acts with the controlled resistor to form a variable attenuator by controlling the gain of the op amp $\frac{1}{2}$ IC102. The output of op amp $\frac{1}{2}$ IC102 is applied to the adder/inverter input so as to complete a feed forward loop having the variable high pass filter and a negative feedback loop having a variable attenuator. Diodes D103, D104 provide overshoot suppression.

The variable attenuator action can be analyzed as follows. When the resistance of the variable resistor is infinite (when its control current is zero), above the cut off frequency of the low pass filter the negative feedback loop can be ignored, while below the cut off frequency the loop has some finite gain. For the component values shown the result is attenuation by about 6 dB for signals within the passband of the low pass filter. When the controlled resistor resistance falls in value (as the control signal rises), the negative feedback is reduced, thus reducing the attenuation and increasing the gain of the loop. At very low controlled resistance values, the overall low frequency response of the main path and the side paths including the feed forward and negative feedback loops approaches a flat response. This arrangement is the equivalent of a variable low frequency boost in combination with a fixed low frequency response cut. Reference to the response curves of FIG. 17 shows the decreasing low frequency cut as the control signal increases. The feed forward high frequency path does not contribute signal output in the frequency band where the negative feedback path does. The high frequency path is a conventional high frequency sliding band response which results in an overall high frequency response of the main path and side paths that is a diminishing high frequency boost as the control signal increases. The overall response drops below a flat response at high frequencies due to the effect of the anti-saturation network.

FIG. 17 indicates generally the desired combined overall response of the variable low frequency boost and variable high frequency pre-emphasis required to minimize noise over the entire audio spectrum in a digital system of the type described. As the high level high frequency content of the audio signal increases, the high frequency pre-emphasis is reduced while at the same time the low frequency boost is increased.

In FIG. 16, the circuit for use in a decoder, complementary to that of FIG. 15 is shown. The general arrangement is based on the embodiment of FIG. 13, e.g., the complementary variable low frequency cut means is formed by a positive feed forward loop while the complementary variable high frequency de-emphasis is achieved in a negative feedback loop. Operation of the circuit is analogous to that of FIG. 15. The control voltage from the delta demodulator is used to operate on a single current controlled resistor that provides both a sliding band high frequency cut and a variable low frequency cut. In this case, as explained further below, the low frequency cut actually consists of a diminishing low frequency boost and the high frequency cut is superimposed on the high frequency pre-emphasis provided by network 40'.

Referring now to the details of FIG. 16, the analog input signal from the delta demodulator is applied to the main path at the input of ½ IC202 around which the anti-saturation network comprised by R204, R206 and C204 is placed as a feedback loop in order to provide the complementary response to the network in FIG. 15. This combination of a feedback loop around the op amp forms a high frequency pre-emphasis rising at 6 dB/octave above about 6 kHz. The adder/inverter output is applied to a 2-pole low pass filter having a cut-off frequency of about 16 kHz, i.e. the op amp ½ IC201 and associated resistors and capacitors C201, R202, R203, C202 and C203. The adder/inverter output is also applied to capacitor C209 which, along with the current controlled resistor (½ IC203) forms a variable high pass filter in a negative feedback loop. The current controlled resistor is controlled by a signal processed from the CVSD delta demodulator applied at the control decode input. The processing includes a peak hold and threshold circuit that includes op amp ½ IC201, diodes D201, D202 resistors 210 and R212 and the reference voltage applied through resistor R211. A low pass filter having a corner frequency of about 700 Hz comprised by R220, R221 and C210 also receives the analog input signal and forms part of a feed forward loop to the input of the op amp (½ IC202). Capacitor C208 has zero impedance at the audio frequencies involved. Consequently, the low pass filter acts with the controlled resistor to form a variable attenuator to control the gain of the loop which includes the op amp ½ IC202. Thus the feed forward loop acts as a variable boost. The output of op amp ½ IC202 is applied to the adder/inverter input so as to complete the negative feedback (variable de-emphasis) loop having the variable high pass filter and the feed forward (variable boost) loop having a variable attenuator. Diodes D203, D204 provide overshoot suppression.

The variable boost loop action can be analyzed as follows. When the resistance of the variable resistor is infinite (when its control current is zero), above the cut off frequency of the low pass filter the feed forward loop can be ignored, while below the cut off frequency the loop has some finite gain. For the component values shown the result is boost by about 6 dB for signals within the passband of the low pass filter. When the controlled resistor resistance falls in value (as the control signal rises), the forward feed is reduced, thus increasing the attenuation and decreasing the loop gain. At very low controlled resistance values, the overall low frequency response of the main path and the side paths including the feed forward and negative feedback loops approaches a flat response. This arrangement is the equivalent of a variable low frequency cut in combination with a fixed low frequency response boost. Reference to the response curves of FIG. 17 shows the decreasing low frequency cut as the control signal increases for the circuit of FIG. 15. In this case, the complementary response results. The negative feedback high frequency path does not contribute signal output in the frequency band where the feed forward low frequency path does. The high frequency path is a conventional high frequency sliding band response which results in an overall high frequency response of the main path and side paths that is a diminishing high frequency de-emphasis as the control signal increases. The response rises above a flat response at high frequencies due to the effect of the anti-saturation network.

In the various embodiments described herein, the digital signals between the digital encoder and decoder are carried by a transmission medium that can take many forms. For example, the digital signals may be directly applied to a recording and playback medium (magnetic tape, discs, etc.) or to a transmitter and receiver system for transmission by wire or through space, etc. Also, further modulation or encoding may be employed prior to recording or transmission.

Although the various encoder and decoder embodiments are useful alone, they may be combined by means of a transmission medium to provide a complete encoder-decoder system.

I claim:

1. An audio analog to digital conversion system receiving analog input audio signals comprising adaptive differential modulation analog to digital conversion means, and frequency dependent variable response means for processing said input audio signals prior to their application to said conversion means, the variable response means having characteristics that boost, relative to other parts of the audio spectrum, signals in the lower portion of the audio spectrum, the degree of boosting rising with the increasing amplitude of signal components in the upper portion of the audio spectrum.

2. The system of claim 1 wherein the degree of boosting is an increasing function of the slope of the input audio signal components in the upper portion of the audio spectrum.

3. The system of claim 1 wherein the degree of boosting is substantially directly proportional to the slope of the input audio signal component amplitudes in the upper portion of the audio spectrum.

4. The system of claim 1 wherein the degree of boosting is controlled by a control signal and said variable response means includes means for generating said control signal derived from the input audio signals.

5. The system of claim 4 wherein said means for generating a control signal includes a high pass and weighting filter and rectifier.

6. The system of claim 1 wherein said conversion means includes means generating a step size signal and wherein the degree of boosting by said variable gain means is controlled by a control signal related to said step size signal.

7. The system of claims 1, 2, 3, 4, 5 or 6 further comprising means for providing a threshold level such that above said threshold level of amplitude of signal components in the upper portion of the audio spectrum boosting occurs and below said threshold no boosting occurs.

8. The system of claims 1, 2, 3, 4, 5 or 6 further comprising further frequency dependent variable response means for processing said input audio signals prior to their application to said conversion means, the further variable response means having characteristics that boost, relative to other parts of the audio spectrum, signals in the upper portion of the audio spectrum, the degree of boosting decreasing with the increasing amplitude of signal components in the upper portion of the audio spectrum.

9. The system of claim 8 wherein said further frequency dependent variable response means has a sliding band characteristic.

10. The system of claim 8 wherein said further frequency dependent variable response means has a fixed band characteristic.

11. The system of claim 1 wherein said adaptive differential modulation analog to digital conversion means comprises an adaptive differential delta modulation conversion means.

12. The system of claim 11 wherein said adaptive differential delta modulation conversion means includes a continuously variable slope delta modulation encoder.

13. An audio digital to analog conversion system receiving digital input audio signals comprising adaptive differential modulation digital to analog conversion means, and frequency dependent variable response means for processing analog audio signals derived from said conversion means, the variable response means having characteristics that cut, relative to other parts of the audio spectrum, signals in the lower portion of the audio spectrum, the degree of cutting increasing with the increasing amplitude of signal components in the upper portion of the audio spectrum.

14. The system of claim 13 wherein the degree of cutting is an increasing function of the slope of signal component amplitudes in the upper portion of the audio spectrum.

15. The system of claim 13 wherein the degree of cutting is substantially directly proportional to the slope of signal component amplitudes in the upper portion of the audio spectrum.

16. The system of claim 13 wherein the degree of cutting is controlled by a control signal and said variable gain means includes means for generating said control signal derived from the analog audio signals.

17. The system of claim 16 wherein said means for generating a control signal includes a high pass and weighting filter and rectifier.

18. The system of claim 13 wherein said conversion means includes means generating a step size signal and wherein the degree of boosting by said variable gain means is controlled by a control signal related to said step size signal.

19. The system of claims 13, 14, 15, 16, 17 or 18 further comprising means for providing a threshold level such that above said threshold level of amplitude of signal components in the upper portion of the audio spectrum cutting occurs and below said threshold no cutting occurs.

20. The system of claims 13, 14, 15, 16, 17 or 18 further comprising a further frequency dependent variable response means for processing analog audio signals derived from said conversion means, the further variable gain means having characteristics that cut, relative to other parts of the audio spectrum, signals in the upper portion of the audio spectrum, the degree of cutting decreasing with the increasing amplitude of signal components in the upper portion of the audio spectrum.

21. The system of claim 20 wherein said further frequency dependent variable response means has a sliding band characteristic.

22. The system of claim 20 wherein said further frequency dependent variable response means has a fixed band characteristic.

23. The system of claim 13 wherein said adaptive differential modulation analog to digital conversion means comprises an adaptive differential delta modulation conversion means.

24. The system of claim 23 wherein said adaptive differential delta modulation conversion means includes a continuously variable slope delta modulation encoder.

25. An analog to digital conversion system according to claim 1 in combination with a digital to analog conversion system for restoring to analog form the signals digitized by said analog to digital conversion system and received via a transmission medium, the digital to analog conversion system comprising:

adaptive differential digital to analog converter means receiving said digitized signals for converting said digitized signals to analog form, and complementary frequency dependent variable response means for processing said analog signals from said digital to analog converter means, said complementary variable response means having the shape of its response characteristic varying complementarily to the response characteristic of the variable response means in said analog to digital conversion system.

26. The system of claim 25 wherein the complementary frequency dependent variable response means varies in response to the analog signal.

27. The system of claim 25 wherein said digital to analog conversion means includes means for generating a step size signal and wherein the complementary frequency dependent variable response means varies in response to a signal related to said step size signal.

28. An analog to digital conversion system according to claim 8 in combination with a digital to analog conversion system for restoring to analog form the signals digitized by said analog to digital conversion system and received via a transmission medium, the digital to analog conversion system comprising:
adaptive differential digital to analog conversion means receiving said digitized signals for converting said digitized signals to analog form,
complementary frequency dependent variable response means for processing said analog signals from said digital to analog conversion means, said complementary variable response means having the shape of its response characteristic varying complementarily to the response characteristic of the low frequency variable response means in said analog to digital conversion system, and
further complementary frequency dependent variable response means for processing said analog signals from said digital to analog conversion means, said complementary variable response means having the shape of its response characteristic varying complementarily to the response characteristic of the high frequency variable response means in said analog to digital conversion system.

29. An audio analog to digital conversion system receiving analog input audio signals comprising adaptive differential modulation analog to digital conversion means, and frequency dependent variable gain means for processing said input audio signals prior to their application to said conversion means, the variable gain means having characteristics that boost signals in the lower portion of the audio spectrum, the degree of boosting rising with the increasing amplitude of signal components in the upper portion of the audio spectrum.

30. An audio digital to analog conversion system receiving digital input audio signals comprising adaptive differential modulation digital to analog conversion means, and frequency dependent variable response means for processing analog audio signals derived from said conversion means, the variable gain means having characteristics that cut signals in the lower portion of the audio spectrum, the degree of cutting increasing with the increasing amplitude of signal components in the upper portion of the audio spectrum.

* * * * *